(12) United States Patent  
Li

(10) Patent No.: US 7,459,782 B1  
(45) Date of Patent: Dec. 2, 2008

(54) STIFFENER FOR FLIP CHIP BGA PACKAGE

(75) Inventor: Yuan Li, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/244,953

(22) Filed: Oct. 5, 2005

(51) Int. Cl.
H01L 23/14 (2006.01)

(52) U.S. Cl. .............................. 257/702; 257/E23.006; 257/678

(58) Field of Classification Search ................ 257/678, 257/702, E23.006
See application file for complete search history.

(56) References Cited

U.S. PATENT DOCUMENTS

| | | | |
|---|---|---|---|
| 5,015,803 A | 5/1991 | Mahulikar et al. | |
| 5,834,337 A * | 11/1998 | Unger et al. | 438/122 |
| 5,909,056 A | 6/1999 | Mertol | |
| 6,015,722 A | 1/2000 | Banks et al. | |
| 6,091,603 A | 7/2000 | Daves et al. | |
| 6,103,550 A | 8/2000 | Camenforte et al. | |
| 6,104,093 A | 8/2000 | Caletka et al. | |
| 6,111,306 A * | 8/2000 | Kawahara et al. | 257/666 |
| 6,111,313 A * | 8/2000 | Kutlu | 257/697 |
| 6,238,954 B1 * | 5/2001 | Ma et al. | 438/122 |
| 6,262,489 B1 | 7/2001 | Koors et al. | |
| 6,313,521 B1 * | 11/2001 | Baba | 257/678 |
| 6,472,762 B1 * | 10/2002 | Kutlu | 257/778 |
| 6,504,242 B1 | 1/2003 | Deppisch et al. | |
| 6,541,847 B1 * | 4/2003 | Hofstee et al. | 257/686 |
| 6,566,743 B1 * | 5/2003 | Zuo | 257/678 |
| 6,566,748 B1 | 5/2003 | Shimizu et al. | |
| 6,617,683 B2 * | 9/2003 | Lebonheur et al. | 257/707 |
| 6,621,160 B2 | 9/2003 | Shibamoto et al. | |
| 6,744,132 B2 | 6/2004 | Alcoe et al. | |
| 6,756,685 B2 | 6/2004 | Tao | |
| 6,771,517 B2 * | 8/2004 | Crapisi et al. | 361/829 |
| 6,773,963 B2 | 8/2004 | Houle | |
| 6,784,535 B1 | 8/2004 | Chiu | |
| 6,784,541 B2 | 8/2004 | Eguchi et al. | |
| 6,909,176 B1 | 6/2005 | Wang et al. | |

(Continued)

OTHER PUBLICATIONS

Julian Norley, High Performance, Lightweight Graphite Heat Sinks / Spreaders, 2002, IEEE, pp. 1-4.*

(Continued)

Primary Examiner—A. Sefer  
Assistant Examiner—Eduardo A Rodela  
(74) Attorney, Agent, or Firm—Weaver Austin Villeneuve & Sampson LLP

(57) ABSTRACT

Provided are semiconductor die flip chip packages with warpage control and fabrication methods for such packages. A package includes a heat spreader that is attached to a die and a stiffener, which are in turn attached to a package substrate. In general, the stiffener is made of a material that has a relatively low CTE value. For example, the stiffener material may have a CTE value less than 12 ppm/° C. The material may also have a relatively low mass density value of less than 8.9 $g/cm^3$. Such a material may include natural graphite or some composite form of it. The result is a package with less bowing and so improved co-planarity (e.g., in compliance with industry specifications) with the surface to which it is ultimately bound; thereby, improving the reliability of the package. Moreover, a package that is relatively lighter and more robust than conventional semiconductor die flip chip packages can be realized.

16 Claims, 1 Drawing Sheet

U.S. PATENT DOCUMENTS

| | | |
|---|---|---|
| 6,949,404 B1 | 9/2005 | Fritz et al. |
| 6,949,415 B2 * | 9/2005 | Alcoe et al. ............ 438/125 |
| 7,307,005 B2 * | 12/2007 | Kobrinsky et al. ......... 438/456 |
| 2003/0067013 A1 * | 4/2003 | Ichihara et al. ............ 257/200 |
| 2004/0016996 A1 | 1/2004 | Tang |
| 2004/0150118 A1 | 8/2004 | Honda |
| 2004/0155358 A1 | 8/2004 | Iijima |
| 2004/0188862 A1 | 9/2004 | Nagarajan et al. |
| 2005/0077604 A1 * | 4/2005 | McCain .................... 257/678 |
| 2005/0224936 A1 * | 10/2005 | Wu et al. .................. 257/678 |
| 2007/0108598 A1 * | 5/2007 | Zhong et al. .............. 257/707 |
| 2007/0164424 A1 * | 7/2007 | Dean et al. ................ 257/707 |

OTHER PUBLICATIONS

Zweben et al., Advanced Materials for Thermal Management—Part 3, Oct. 2001, Cooling Zone Magazine Online, Entire Article (6 pages).*

Harper et al., Electronic Packaging and Interconnection Handbook, 2000, McGraw/Hill, Third Edition, p. 2.63, paragraphs 2.5.1 and 2.5.1.1.*

Charles A. Harper, Electronic Packaging and Interconnection Handbook, 2000, McGraw-Hill, 3rd Edition, p. 3.3.*

Charles A. Harper, Electronic Packaging and Interconnection Handbook, 1991, McGraw-Hill, 1st Edition, p. 7.22.*

* cited by examiner

STIFFENER FOR FLIP CHIP BGA PACKAGE

BACKGROUND

This invention relates generally to semiconductor device package assembly, and in particular to semiconductor die flip chip package assembly. More specifically, the invention relates to an innovative material approach for a stiffener to reduce weight and warpage in a flip chip ball grid array (BGA) package.

In semiconductor device package assembly, a semiconductor die (also referred to as an integrated circuit (IC) chip or "chip") may be bonded directly to a package substrate. Such die is formed with bumps of solder affixed to its I/O bonding pads. During packaging, the die is "flipped" onto its front surface (e.g., active circuit surface) so that the solder bumps form electrical and mechanical connections directly between the die and conductive metal pads on the package substrate. Underfill is generally applied between the gap formed by the solder bumps in order to further secure the die to the package substrate. A stiffener made of substantially copper is then placed around the die and attached to the package substrate. A heat spreader is then attached over the die and the stiffener. A semiconductor device package of this type is commonly called a "semiconductor die flip chip package."

A problem with such a semiconductor die flip chip package is that it is subject to different temperatures during the packaging process. For instance, different temperatures arise with the cool down from the solder joining temperature and the underfill curing temperature. As a result, the package is highly stressed due to the different coefficients of thermal expansion (CTE) of the various package and die materials.

The high stress experienced by bonded materials during cooling may cause them to warp or crack and cause the package structure to bow. This problem is exacerbated in the case of a relatively large package, for example a 40 mm×40 mm or larger package, or a relatively large die, for example a 20 mm×20 mm or larger die. Typically, the die, which has a relatively low CTE, is attached to an organic package substrate, which has a relatively high CTE. In addition, this problem is exacerbated in the case of a relatively thick die processed from a larger diameter wafer, for example a 300 mm diameter wafer. In some cases, the bow of the package will exceed the co-planarity specification for the semiconductor die flip chip package.

As the semiconductor industry continually seeks to improve the electrical performances of semiconductor die flip chip packages, there is a movement towards thinner package substrates and particularly package substrates with thinner cores. However, the thinner package substrates are more susceptible to the stress resulting from CTE mismatches of materials within the package. Further, with the advent of low-K dice, the high stress caused by the different CTE is even more of a concern. Low-K dielectric material layers in the low-K die are relatively brittle, rendering the low-K die susceptible to failure at even lower stress levels than conventional dice with FSG or USG dielectrics.

Accordingly, what is needed are semiconductor die flip chip packages and packaging methods that control package warpage (e.g., co-planarity) within acceptable limits for incorporation into electronic devices, thereby, enhancing the reliability of the semiconductor die flip chip package.

SUMMARY OF THE INVENTION

To achieve the foregoing, the present invention provides semiconductor die flip chip packages with warpage control. The present invention also provides fabrication methods for such packages. In general, a package includes a stiffener that is made of a material that complements the other components in the package by managing the package stresses due to CTE mismatches between various package components. For example, the stiffener may have a material with a relatively low CTE value and/or mass density value as compared to conventional stiffener materials such as copper. The result is a package with less bowing and so improved co-planarity (e.g., in compliance with industry specifications) with the surface to which it is ultimately bound; thereby, improving the reliability of the package. Moreover, a package that is relatively lighter and more robust than conventional semiconductor die flip chip packages can be realized.

In one aspect, the invention relates to a semiconductor device package that includes a package substrate, a die, and a stiffener. The die is coupled to the package substrate whereas the stiffener is positioned around the die and coupled to the package substrate. The stiffener is composed of a material that has a CTE value less than 12 ppm/° C. For instance, the stiffener may comprise graphite, e.g., natural graphite.

In another aspect, the invention relates to a method for packaging a semiconductor device. A package substrate is provided. A die is coupled to the package substrate. A stiffener is coupled to the package substrate and positioned around the die. The stiffener is composed of a material that has a CTE value less than 12 ppm/° C. For instance, the stiffener may comprise graphite, e.g., natural graphite.

In yet another aspect, the invention relates to a semiconductor device package that includes a package substrate, a die coupled to the package substrate, and means for controlling the co-planarity of the semiconductor device package. The means has a CTE value less than 12 ppm/° C.

These and other features and advantages of the invention will be presented in more detail below with reference to the associated drawings.

DETAILED DESCRIPTION OF SPECIFIC EMBODIMENTS

Figure 1:
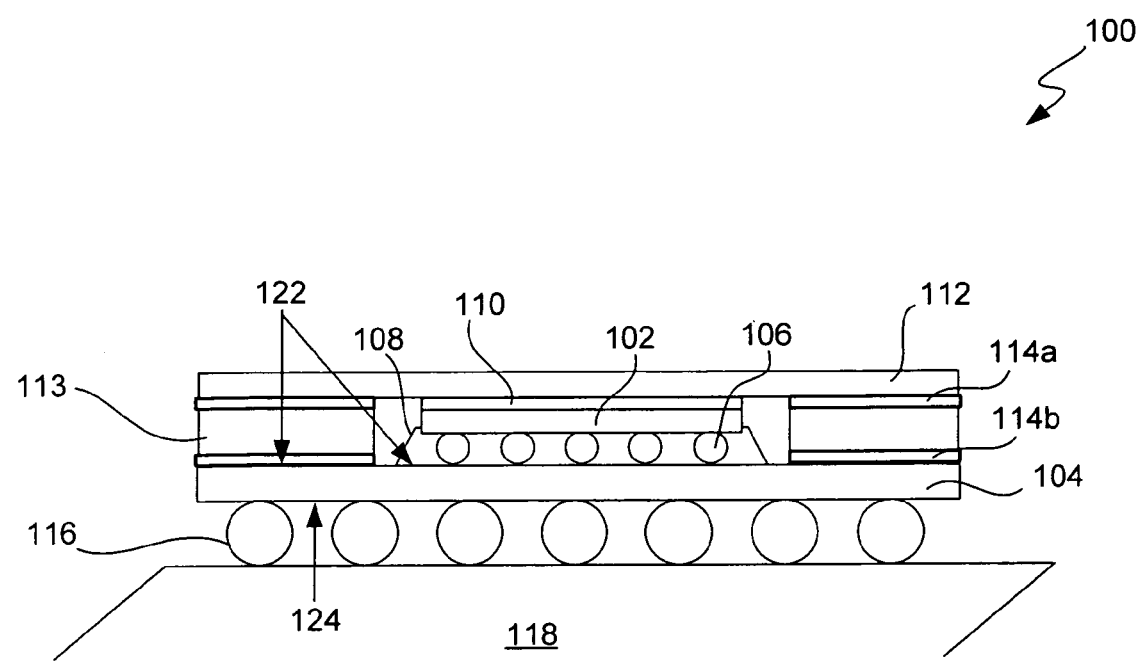
FIG. 1 illustrates a cross-sectional view of a semiconductor device package according to various embodiments of the present invention.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides semiconductor die flip chip packages with warpage control. The present invention also provides fabrication methods for such packages. A package includes a heat spreader that is attached to a die and a stiffener, which are in turn attached to a package substrate. In general, the stiffener is made of a material that has a relatively low CTE value. The material may also have a relatively low mass density value. Such a material may include natural graphite or some composite form of it. The result is a package with less bowing and so improved co-planarity (e.g., in compliance with industry specifications; about 0.20 mm or 8 mils per JDEC) with the surface to which it is ultimately bound; thereby, improving the reliability of the package. Moreover, a package that is relatively lighter and more robust than conventional semiconductor die flip chip packages (particularly for large package sizes and large die sizes) can be realized. The present invention further allows the implementation of thinner package substrates (including coreless package substrates) and/or low-K Si dice.

Many conventional package constructions are inadequate to prevent bowing of packages containing semiconductor dice beyond the co-planarity tolerances of the industry standards. Furthermore, conventional package constructions are inadequate to redistribute/absorb the bowing pressures away from the semiconductor die and to the stronger areas of the package (e.g., heat spreader; stiffener; substrate). Therefore, a variety of strategies are used in conjunction with the stiffener in accordance with the invention. Specific embodiments of the present invention are illustrated and described with reference to FIG. 1.

FIG. 1 illustrates a cross-sectional view of a semiconductor device package according to various embodiments of the present invention. As shown, a semiconductor die flip chip package 100 having a die (e.g., Si die, low-K Si die, or extra low-K Si die) 102 and substrate 104 are electrically connected by solder bumps 106. The die typically has a CTE of about 2-3 ppm/° C. (e.g., 2.6 ppm/° C.).

A low-K Si die includes a plurality of layers of low-K dielectric material having a CTE between the range of 20 ppm/° C. and 50 ppm/° C. The low-K dielectric material typically has a dielectric constant below that of silicon dioxide and ranges from about 2.6 to 3.5. An extra low-K die includes a plurality of layers of extra low-K dielectric material having a CTE between the range of 10 ppm/° C. and 40 ppm/° C. along with a dielectric constant between 2.2 and 2.6.

Generally, the plurality of dielectric layers can have any number of low-K or extra low-K materials including, but not limited to: aerogel, xerogel, NANOGLASS® (available from Honeywell, Morristown, N.J.), FLARE™ (available from Honeywell, Morristown, N.J.), SiLK™ (available from The Dow Chemical Company, Midland, Mich.), LKD® (available from JSR Micro, Sunnyvale, Calif.), CORAL® (available from Novellus Systems, Inc., San Jose, Calif.), and Black Diamond™ (available from Applied Materials, Inc., Santa Clara, Calif.). Black Diamond™ typically has a CTE in the range of about 20-23 ppm/° C. whereas SiLK™ has a CTE of about 50 ppm/° C. The overall die CTE remains in the same range as a non-low-K die, about 2-3 ppm/° C. (e.g., 2.6 ppm/° C.).

Although some semiconductor die flip chip packages (e.g., See U.S. patent application Ser. Nos. 10/305,671, 10/849,651, or 10/719,451, each of which is hereby incorporated by reference) may incorporate a form of warpage control that reduces the amount of warpage to within industry co-planarity specifications and allows an enclosed Si die flip-chip to operate reliably, it may be possible to further improve the performance of such packages, at least in some implementations. This is especially evident in the case of an enclosed low-K (or extra low-K) Si die. This is because many low-K materials are brittle and easily susceptible to cracking or damage under less mechanical or thermal stress (due to CTE mismatches) than that experienced by a conventional Si die.

Typically, the low-K materials form a plurality of layers that has a thickness which is 1/100 (e.g. 5 microns) of the overall low-K Si die thickness (e.g., 500-750 microns). In some cases, the thickness of the plurality of low-K layers is less than 6 microns. Therefore, the present invention is also directed to improve the redistribution of mechanical or thermal stress, caused from the CTE mismatches within the die and package, away from the weaker parts to the stronger parts of the die or package.

Die 102 may have dimensions on the order of about 4-900 mm² or 19-32 mils thick. It is important to note that the present invention is advantageously applied to packages having a large die size, for example, 400 mm² or larger (e.g., 20×20 mm, 20×23 mm, 22×22 mm, 2.3×28 mm, or 26×32 mm). Furthermore, the invention is advantageously applied to a thicker die, which is generally produced from a larger diameter wafer (e.g., 29 mil thick die from a 300 mm diameter wafer). This is because larger or thicker dice cause more mechanical stress to be produced within the dice and/or packages.

Once the die is chosen, the die may be attached to a package substrate 104. In general, package substrate 104 may have dimensions on the order of about 23×23 mm² to 45×45 mm². Package substrate 104 is typically composed of an organic or laminate material, such as fiberglass, PTFE (such as Teflon™, available form Gore, Eau Claire, Wis.) bismaleimide triazine (BT) resin, epoxy laminates or ceramic-plastic composites. Package substrate 104 may have a CTE of about 15-20 ppm/° C., a core CTE of about 13-15 ppm/° C., a buildup layer CTE of about 45-100 ppm/° C., and/or a modulus of about 24-25 GPa)

As mentioned earlier, there is a movement in the semiconductor industry towards implementing semiconductor die flip chip packages with thinner package substrates, particularly package substrates with thinner cores. Generally, thinner package substrates have lower inductance, lower signal propagation delay from die to PCB, and higher signal integrity; thereby, improving the electrical performance of the semiconductor die flip chip package. A conventional package substrate may include a core with a thickness between 800 and 1000 microns. Thinner package substrates may include a core with a thickness between 60 and 400 microns. Some thinner package substrates may even be coreless. It will be appreciated by those skilled in the art that the present invention may be adapted to use thinner package substrates while in compliance with industry co-planarity and reliability specifications.

Die 102 and package substrate 104 are electrically connected and mechanically bonded in a solder joining operation. The unbonded die has an array of solder bumps arranged on its front surface. The solder is generally composed of a lead material having a melting point of about 300° C., for example. Alternatively, the solder can be a eutectic material having a melting point of about 180° C. or higher (e.g., 183° C.).

Prior to bonding the die to a substrate, solder flux is generally applied to either the front surface of the die or the package substrate surface (e.g., die side 122 of substrate 104). The flux serves primarily to aid the flow of the solder, such that the solder bumps make good contact with pre-solder covered metal pads on the package substrate. It may be applied in any of a variety of methods, including brushing or spraying, or dipping the die into a thin film, thereby coating the solder bumps with flux. The flux generally has an acidic component, which removes oxide barriers from the solder surfaces, and an adhesive quality, which helps to prevent the die from moving on the package substrate surface during the assembly process. Non-cleaning or high temperature cleaning fluxes, as are known in the art, may be used.

After the flux is applied, the die is aligned with and placed onto a placement site on the package substrate such that the die's solder bumps are aligned with pre-solder covered metal pads on the die side 122 of substrate 104. The pre-solder covered metal pads are electrically connected to the electrical traces within the substrate. Heat, typically above 200° C. (e.g., 240° C.), is applied to one or more of the die and the package substrate, causing the solder bumps 106 to alloy and form electrical connections between die 102 and package substrate 104. The package is then cooled to harden the connection. Then, where necessary, the remaining flux residue is substantially removed in a cleaning step, for instance by washing with an appropriate solvent.

An underfill 108 is generally applied in order to enhance the mechanical bonding of the die and substrate. Underfill 108 generally has a CTE of about 32 ppm/° C. In one embodiment, underfill 108, typically a thermo-set epoxy, such as is available from Hysol Corporation of Industry, Calif. (e.g., product numbers 4549, 8439), Ablestik Laboratories of Rancho Domingo, Calif., or Namics, Reno, Nev. (e.g., product no. 8439-1) is dispensed into the remaining space (or "gap") between the die and the substrate. In a typical procedure, a bead of thermo-set epoxy is applied along one edge of the die where it is drawn under the die by capillary action until it completely fills the gap between the die and the package substrate. Slight heating of the package substrate during dispensing of the underfill epoxy may assist the flow. In some cases, the underfill epoxy flow is further assisted by vacuum, or, alternatively, by injection of the epoxy into the gap. It should be noted that there may be other methods for applying underfill and that any suitable underfill composition (including those incorporating solder flux) application may be used in conjunction with the present invention.

Underfill 108 is cured by heating the substrate and die to an appropriate curing temperature for the underfill material, generally about 150° C., and curing for a specific amount of time at the temperature. In this manner the process produces an electrically and mechanically bonded semiconductor chip assembly, with the underfill material allowing a redistribution of the stress at the connection between the die and the substrate from the solder joints only to the entire substrate-die area. It is important to note that during the cooling down from the underfill cure temperature to the room temperature, large amounts of stress due to the CTE mismatch between the substrate (CTE about 17 ppm/° C.) and the die (CTE about 2.6 ppm/° C.) may cause the package to warp. In general, warpage is greatest after the underfill is applied.

Package 100 includes a heat spreader 112 composed of a high modulus (e.g., about 60 to 200 GPa), high thermal conductivity (e.g., about 160 to 400 W/cm.K; 380 W/m.K for copper) material, having substantially the same dimensions as the package substrate. The heat spreader material is typically selected to have a CTE the same as or sufficiently similar to the substrate in order to apply a counter stress to the die and to reduce the bow of the package 100 to within the tolerance of the industry co-planarity specification (about 0.20 mm or 8 mils per JDEC). Typical organic substrate materials have CTEs in the range of about 15-20 ppm/° C.; therefore the heat spreader should have a CTE in this range. Moreover, the heat spreader material should have a modulus of elasticity and thickness to balance that of the substrate. Examples of suitable materials include copper; nickel-plated copper; aluminum; and copper alloys (such as Olin194 (ASTM Spec. No. B465), available from Olin Brass, East Alton, Ill.), each with a thickness selected to achieve a balance with the force applied to the front surface of die 102 by substrate 104.

Heat spreader 112 is connected to the back surface of die 102. The connection is provided via a relatively high thermal conductivity thermal interface material (TIM) 110 that creates a bond between heat spreader 112 and the back surface of die 102. In one embodiment, thermal interface material 110 includes thermal polymers having a modulus higher than or equal to 0.04 MPa (e.g., 0.06 MPa). Various thermal interface materials are available from Honeywell, Morristown, N.J. and from Ablestik Laboratories of Rancho Domingo, Calif., or Namics, Reno, Nev. Typically, thermal interface material 110 is cured at about 150° C.

Heat spreader 112 is also connected to die side 122 of substrate 104 via stiffener 113. The stiffener (also sometimes referred to as a "picture frame") is typically a flat piece of structure having substantially the same dimensions as the package substrate with a window in its center to clear the die. One purpose of the stiffener is to constrain the substrate in order to prevent its warpage or other movement relative to the die, which may be caused by thermal cycling (e.g., changes in temperature) during package assembly, reliability testing, or field operation. Such movement may result from the different coefficients of thermal expansion (CTE) of the die and substrate materials, and may produce stress in the die or the package in causing electrical and mechanical failures.

In accordance with the present invention, a conventional semiconductor die flip chip package construction is improved by the application of a warpage and stress control structure formed by a stiffener having particular material properties. The material may have an in-plane CTE value less than 12 ppm/° C. (e.g., 10 ppm/° C., ppm/° C., 0 ppm/° C., or about −2.4 ppm/° C.). The material may have a thermal conductivity value greater than 300 W/mK (e.g., about 370 W/mK). Further, the material may have a modulus value less than 129 GPa (e.g., about 42 GPa). The mass density value for the stiffener material can also be less than 8.9 g/cm$^3$ (e.g., about 1.94 g/cm$^3$).

The invention does not require substantial changes to conventional semiconductor flip chip packages. One aspect of the present invention provides a unique usage of a predominant stiffener material having particular material properties. In general, the stiffener material of the present invention may have a lower mass density (e.g., 1.94 g/cm$^3$ vs. 8.9 g/cm$^3$ for Cu), in-plane CTE (e.g., −2.4 ppm/° C. vs. 17 ppm/° C. for Cu), or Young's modulus (e.g., 42 GPa vs. 129 GPa for Cu) than conventional stiffener materials such as Cu, Al, or AlSiC. Yet, the stiffener material may have a high thermal conductivity value (e.g., 370 W/mK) similar to that of copper (e.g., 380 W/mK).

A suitable stiffener material may include graphite, such as natural graphite e.g., EGRAF HS-400, which is available from GrafTech International Ltd. of Wilmington, Del. EGRAF HS-400 has a typical density of 1.94 g/cm$^3$, thermal conductivity (in-plane direction) of 370 W/mK, thermal conductivity (thickness direction) of 6.5 W/mK, thermal anisotropy of 57, specific heat capacity of 846 J/kgK, resistivity (in-plane direction) of 6 moh mm, CTE (30-100° C.) (in-plane direction) of −2.4 ppm/° C., CTE (30-100° C.) (thickness direction) of 54 ppm/° C., flexural strength (in-plane direction) of 70 MPa, Young's Modulus (in-plane direction) of 42 GPa, and hardness (in-plane direction) of 96 Rockwell R.

Any suitable stiffener material may be used provided that it embodies similar properties as graphite. For example, materials containing continuous carbon fibers may be used. The stiffener material may further include either a non-metallic or metallic material. For example, copper, aluminum, or ceramic may be used. It should be noted that conventional stiffener materials of Cu, Al, or AlSiC have CTE values of 17 ppm/° C., 23 ppm/° C., and 12 ppm/° C. respectively.

Referring back to FIG. 1, heat spreader 112 is connected to die side 122 of substrate 104 where the connection of heat spreader 112 to stiffener 113 is made with an adhesive 114a and the connection of stiffener 113 to substrate 104 is made with an adhesive 114b. Adhesives 114a and 114b can be any suitable adhesive for connecting stiffener 113 to heat spreader 112 and package substrate 104. In one embodiment, adhesives 114a and 114b have a relatively low modulus to allow for some flexibility in the overall connection between heat spreader 112 and substrate 104. Generally, low modulus adhesives for this purpose are silicone-based adhesives. In one embodiment, adhesives 114a and 114b include having a modulus lower than or equal to 2 GPa. In another embodiment, they have a modulus lower than or equal to 1 GPa. In a preferred embodiment, product JM2500 (modulus of 0.4 GPa) available from Honeywell, Morristown, N.J. may be used. Furthermore, adhesive 114a and 114b may have an associated glass transition temperature Tg in the range between 30° C. and 70° C.

Although adhesives 114a and 114b can be the same material or at least embody some of the same characteristics described herein, another embodiment allows them to be different. For example, adhesive 114a may have a modulus greater than that of adhesive 114b, such as where adhesive 114a has a modulus of about 6 GPa and where adhesive 114b has a modulus of about 0.4 GPa. In addition, adhesive 114a may have a Tg greater than that of adhesive 114b. In one embodiment, adhesive 114a may have a Tg equal or greater to 100° C., such as about 126° C. Generally, adhesives are cured at about 150° C.

The stiffener of the present invention provides sufficient control to accommodate (e.g., adsorb/redistribute) the stresses of material CTE mismatches within the semiconductor die flip chip package (thereby reducing the risk of delaminating and cracking of the die, underfill, or substrate) while applying appropriate force to prevent bowing of the package outside the industry specifications. In this construction, the forces generated by the CTE mismatch are absorbed by the stiffener and/or redistributed away from the die and toward the stronger portions of the package (e.g., heat spreader; stiffener; substrate). As a result, semiconductor die flip chip package 100 may be more reliably used and more reliably connected to a printed circuit board 118 via a ball grid array (BGA) of solder balls 116 on the board side 124 of substrate 104.

EXAMPLE

The following example provides modeling results for a semiconductor die flip chip package with warpage control in accordance with specific embodiments of the present invention. It should be understood the following is representative only, and that the invention is not limited by the detail set forth in this example.

A Stratix II device, available from Altera, Inc. of San Jose, Calif., was selected in modeling a semiconductor die flip chip package in accordance to the present invention. The Stratix II device included a 40 mm×40 mm FCBGA package with a die (22 mm×22 mm; 0.78 mm thick) and a package substrate (3-2-3 buildup type; 0.8 mm thick core). It should be noted that the package substrate is also available from Kyocera of Kyoto, Japan. The die had a CTE of about 2.6-3 ppm/° C. whereas the package substrate had a CTE of about 17-18 ppm/° C. Other significant CTE values included: underfill (32 ppm/° C.); heat spreader (17 ppm/° C.). The heat spreader was 0.5 mm thick whereas the stiffener was 0.9 mm thick with a ring width of 4 mm. The modulus for the heat spreader, stiffener, and the package substrate were about 129 GPa, 42 GPa, and 24-25 GPa respectively.

The semiconductor die flip chip package was subjected to modeled warpage testing and to modeled reliability testing (e.g., industrial grade reliability test of thermal cycling condition B (−55° C. to 125° C.); JESD22-A104; Mil Std 1010) and compared to a conventional Stratix II device of similar configuration except for the new stiffener in accordance to the present invention. The new stiffener (predominantly graphite based, e.g., EGRAF HS-400) has a CTE of −2.4 ppm/° C. whereas the conventional stiffener (predominantly Cu based) has a CTE of 17 ppm/° C. Some of the modeling results of the comparison are provided in the following Table 1.

TABLE 1

|  | Weight (g) | Warpage (mil) | Substrate Stress VM (MPa) |
| --- | --- | --- | --- |
| Current Package | 17 | 7.84 | 87.8 |
| New Package | 13.4 | 6.16 | 74.3 |
| % Improvement | 21% | 21% | 15% |

Table 1 shows the comparison between the package with a conventional stiffener (denoted by "Current Package") and the package with the new stiffener (denoted by "New Package"). As shown, the new package has significant improvements over the current package in package weight, warpage, and substrate stress. Other modeling results are provided in the following Table 2.

TABLE 2

|  | Underfill Shear Stress (MPa) | Silicon 1$^{st}$ Principal (MPa) | Silicon Tensile (MPa) | Silicon Shear (MPa) |
| --- | --- | --- | --- | --- |
| Current Package | 88 | 86 | 15 | 25 |
| New Package | 82 | 84 | 14 | 25 |
| % Improvement | 7% | 2% | 7% | 0% |

Table 2 shows the comparison between the current package and the new package in other areas of the package. As shown, the new package still has some improvements over the current package in stress measurements within the underfill and silicon die. Therefore, the new package can provide a flatter, lighter, and more robust semiconductor die flip chip package than the current package. Since substrate cracks are one of the major failure modes for current packages, the improvement in substrate stress in the new package results should provide a more reliable semiconductor die flip chip package.

Each of the modeling tests, e.g., Weight, Warpage, Substrate Stress, Underfill Shear Stress, Silicon 1$^{st}$ Principal, Silicon Tensile, and Silicon Shear, is well known in the semiconductor industry. The Warpage results are used to determine the potential level of package co-planarity to another surface, which is generally the surface that the package is mounted. The Substrate Stress VM results are used to determine the potential level of stress at the substrate, especially at the underfill-substrate interface. The Underfill Shear Stress results are typically used to determine the potential level of underfill delamination. The Silicon 1$^{st}$ Principal results are use to determine the potential level of die surface cracking. The Silicon Tensile and the Silicon Shear results are use particularly for low-K Si die considerations.

Modeled warpage testing for such packages generally involves simulating industry available and accepted co-planarity standards, such as JEDEC specification MS-034. In practice, however, measuring the warpage or bow involves using a commercially available warpage or bow measuring tool. For example, RVSI Models LS7700, LS3700, and LS7350 DB, available from Robotic Vision Systems, Inc. of Nashua, N.H. may be used. Generally, warpage testing is conducted and measured after the semiconductor die flip chip package has been formed and before the semiconductor die flip chip package is subjected to reliability testing.

Similarly, modeled reliability testing for such packages generally involves simulating industry available and accepted reliability testing standards such as those established by the Electronic Industries Association (EIA) or the Joint Electron Device Engineering Council (JEDEC). For example, JESD22-A104 and Mil Std 1010. In one embodiment, simulated industrial grade reliability testing is performed and includes cycling the temperature between −55° C. to 125° C. and/or running 1000 cycles. Temperature cycling is conducted to determine the resistance of the die to high and low temperature extremes. This environmental stress test is designed to simulate the extensive changes in temperature to which the die and the package may be exposed. Typically, to pass the test, the die, layers of low-K material, substrate, underfill, and/or other package components should not show signs of damage such as cracking, chipping, delaminating, or breaking.

CONCLUSION

The foregoing invention presents many advantages over conventional flip chip packages. For example, the ability to use organic substrates instead of ceramic substrates facilitates in lowering costs, improving electrical performance, and reducing board level reliability problems. Another advantage is that the foregoing invention provides a packaging solution for thin package substrates (even coreless package substrates), low-K Si dice, and future extra low-K Si dice. The material of the stiffener allows sufficient control of the stresses caused by the CTE mismatches of the various materials in the die and package; thereby, providing a semiconductor die flip chip package with less bowing and so improved co-planarity (in compliance with industry specifications) with the surface (e.g., PCB board) to which it is ultimately bound. Furthermore, the material of the stiffener allows a lighter package to be realized, which is beneficial for applications where weight is a factor.

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope and equivalents of the appended claims.

What is claimed is:

1. A semiconductor device package, comprising:
    a package substrate;
    a flip chip die coupled to the package substrate;
    a stiffener, coupled to the package substrate, and positioned laterally around the periphery of the die so that a surface of the die is exposed, wherein the stiffener is composed of a graphite material having a first CTE value sufficient to absorb or redistribute stresses caused by thermal mismatches between the die and the substrate; and
    a separate thermally conductive heat spreader having a second CTE value greater than the first CTE value and attached to the stiffener and the exposed surface of the die.

2. The semiconductor device package of claim 1, wherein the CTE value for the stiffener material is less than 5 ppm/° C.

3. The semiconductor device package of claim 1, wherein the stiffener material has a mass density value less than 8.9 g/cm$^3$.

4. The semiconductor device package of claim 1, wherein the stiffener includes a heat spreader surface and a package surface, the package surface being used to couple the stiffener to the package substrate.

5. The semiconductor device package of claim 4, wherein the heat spreader is also coupled to the heat spreader surface of the stiffener.

6. The semiconductor device package of claim 1, wherein the stiffener comprises a window in its center to clear the die.

7. The semiconductor device package of claim 1, wherein the stiffener surrounds the die.

8. A semiconductor device package, comprising:
    a package substrate;
    a flip chip die coupled to the package substrate;
    a stiffener made from a graphite material, coupled to the package substrate, and having a recess region to accommodate the die and four sides positioned laterally around the die so that a surface of the die is exposed through the recess region, wherein the stiffener is composed of a material having a first CTE value; and
    a separate thermally conductive heat spreader having a second CTE value which is higher than the first CTE value and attached to the stiffener and the exposed surface of the die.

9. A semiconductor device package, comprising:
    a package substrate;
    a flip chip die coupled to the package substrate;
    a graphite stiffener, coupled to the package substrate, and having a recess region to accommodate the die and four sides positioned laterally around the die so that a surface of the die is exposed through the recess region, wherein the stiffener is composed of a material having a CTE value less than 12 ppm/° C. and a thermal conductivity value greater than 300 W/mK; and
    a separate thermally conductive heat spreader in contact with the die and the four sides of the stiffener and having a CTE value greater than the stiffener.

10. A method for packaging a semiconductor device, comprising:
    providing a package substrate;
    coupling a flip chip die to the package substrate;
    coupling a graphite stiffener to the package substrate having a recess region to accommodate the die and four sides around the periphery of the die so that a surface of the die is exposed through the recess region, wherein the stiffener is positioned laterally around the die within the recess region and composed of a material having a CTE value sufficient to absorb or redistribute stresses caused by thermal mismatches between the die and the substrate; and
    coupling a separate thermally conductive heat spreader having a second CTE value greater than the first CTE value to the stiffener and the exposed surface of the die.

11. The method of claim 10, wherein the CTE value for the stiffener material is about −2.4 ppm/° C.

12. The method of claim 10, wherein the stiffener material has a modulus value less than 129 GPa.

13. The method of claim 12, wherein the stiffener material has a mass density value less than 8.9 g/cm$^3$.

14. The method of claim 10, wherein the stiffener includes a heat spreader surface and a package surface, wherein coupling the stiffener to the substrate comprises:
   coupling the package surface of the stiffener to the package substrate.

15. A method for packaging a semiconductor device, comprising:
   providing a package substrate, wherein the package substrate includes a core with a thickness between 800 and 1000 microns;
   coupling a flip chip die to the package substrate;
   coupling a graphite stiffener to the package substrate, wherein the stiffener is positioned laterally around the die so that a surface of the die is exposed and composed of a material having a CTE value less than 12 ppm/° C.; and
   coupling a separate thermally conductive heat spreader to the stiffener and the exposed surface of the die, wherein the heat spreader has a CTE value greater than the stiffener.

16. A semiconductor device package, comprising:
   a package substrate, wherein the package substrate includes a core with a thickness between 800 and 1000 microns;
   a flip chip die coupled to the package substrate; and
   a graphite stiffener positioned laterally around the die so that a surface of the die is exposed, the stiffener having a CTE sufficient for substantially controlling the co-planarity of the semiconductor device package.

* * * * *